(12) United States Patent
Komori et al.

(10) Patent No.: US 9,490,139 B2
(45) Date of Patent: Nov. 8, 2016

(54) METHOD AND APPARATUS FOR FORMING SILICON FILM

(71) Applicant: TOKYO ELECTRON LIMITED, Tokyo (JP)

(72) Inventors: Katsuhiko Komori, Nirasaki (JP); Mitsuhiro Okada, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/449,744

(22) Filed: Aug. 1, 2014

(65) Prior Publication Data
US 2015/0037975 A1    Feb. 5, 2015

(30) Foreign Application Priority Data
Aug. 2, 2013 (JP) .................. 2013-161773

(51) Int. Cl.
| | |
|---|---|
| H01L 21/205 | (2006.01) |
| H01L 21/285 | (2006.01) |
| C23C 16/24 | (2006.01) |
| H01L 21/3205 | (2006.01) |
| H01L 21/3213 | (2006.01) |
| H01L 21/3215 | (2006.01) |
| C23C 16/04 | (2006.01) |
| C23C 16/455 | (2006.01) |
| H01L 21/768 | (2006.01) |

(52) U.S. Cl.
CPC ....... *H01L 21/32055* (2013.01); *C23C 16/045* (2013.01); *C23C 16/24* (2013.01); *C23C 16/45523* (2013.01); *H01L 21/28556* (2013.01); *H01L 21/32135* (2013.01); *H01L 21/32155* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 2009/0061602 A1* | 3/2009 | Lee ................... | H01L 21/02532 438/486 |
| 2011/0287629 A1* | 11/2011 | Kakimoto et al. ............ | 438/652 |
| 2013/0005142 A1* | 1/2013 | Kakimoto et al. ............ | 438/658 |
| 2013/0023110 A1* | 1/2013 | Kakimoto et al. ............ | 438/482 |
| 2013/0244394 A1* | 9/2013 | Kim ....................... | H01L 28/91 438/381 |

FOREIGN PATENT DOCUMENTS

| | | |
|---|---|---|
| JP | 10-321556 A | 12/1998 |
| JP | 2012-004542 A | 1/2012 |
| JP | 2013-026513 A | 2/2013 |
| JP | 2013-033933 A | 2/2013 |
| JP | 2013-239717 A | 11/2013 |
| JP | 2013-247332 A | 12/2013 |

\* cited by examiner

*Primary Examiner* — Pamela E Perkins
(74) *Attorney, Agent, or Firm* — Nath, Goldberg & Meyer; Jerald L. Meyer (57) ABSTRACT

Provided is a method of forming a silicon film in a groove formed on a surface of an object to be processed, which includes: forming a first silicon layer on the surface of the object to be processed to embed the groove; doping impurities near a surface of the first silicon layer; forming a seed layer on the doped first silicon layer; and forming a second silicon layer containing impurities on the seed layer.

6 Claims, 6 Drawing Sheets

|  | Example 1 | | Comparative Example 1 | Comparative Example 2 | | Comparative Example 3 | |
|---|---|---|---|---|---|---|---|
| Doping step | Present | 400 degrees C 200Torr 60min | None | Present | 400 degrees C 200Torr 30min | Present | 400 degrees C 200Torr 60min |
| Second seed layer forming step | Present | 520 degrees C 1min | None | None | | None | |

METHOD AND APPARATUS FOR FORMING SILICON FILM

CROSS-REFERENCE TO RELATED APPLICATION

This application claims the benefit of Japanese Patent Application No. 2013-161773, filed on Aug. 2, 2013, in the Japan Patent Office, the disclosure of which is incorporated herein in its entirety by reference.

TECHNICAL FIELD

The present disclosure relates to a method and apparatus of forming a silicon film.

BACKGROUND

In the manufacturing process of a semiconductor device or the like, there has been a process of forming an electrode by forming a trench and hole-shaped groove (contact hole) in an interlayer insulating film on a silicon substrate, and by embedding a silicon film (Si film) such as a polysilicon film, an amorphous silicon film, and a polysilicon film and an amorphous silicon film doped with impurities.

In such a process, for example, there has been proposed a method of forming a contact hole in the interlayer insulating film on the silicon substrate, forming the polysilicon layer using a CVD (Chemical Vapor Deposition) method, and forming the polysilicon film again after slight etching of the polysilicon film.

Due to the miniaturization of semiconductor devices, the aspect ratios of the trenches in which Si film is embedded has been increasing. Due to higher aspect ratios, voids can occur when the Si film is embedded. The voids may degrade the Si film's performance as an electrode.

Particularly, when an Si film doped with phosphorus (P) is embedded in a contact hole and its surface roughness is not satisfactory, there is a problem in that seams, voids, or the like may easily occur. This problem is particularly severe when the Si film is doped with high concentrations of P.

SUMMARY

Some embodiments of the present disclosure provide a method and apparatus of forming a silicon film capable of appropriately embedding the silicon film. Furthermore, some embodiments of the present disclosure provide a method and apparatus of forming a silicon film capable of suppressing degradation of surface roughness.

One embodiment of the present disclosure is a method of forming a silicon film in a groove formed on a surface of an object to be processed, which includes: forming a first silicon layer on the surface of the object to be processed to embed the groove; doping impurities near a surface of the first silicon layer; forming a seed layer on the doped first silicon layer; and forming a second silicon layer containing impurities on the seed layer.

Another embodiment of the present disclosure is an apparatus of forming a silicon film in a groove formed on a surface of an object to be processed, which includes: a first layer forming unit configured to form a first silicon layer on the surface of the object to be processed to embed the groove; a doping unit configured to dope impurities near a surface of the first silicon layer formed by the first layer forming unit; a seed layer forming unit configured to form a seed layer on the first silicon layer doped with the impurities by the doping unit; and a second layer forming unit configured to form a second silicon layer containing impurities on the seed layer formed by the seed layer forming unit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereafter, a method and apparatus of forming a silicon film of the present disclosure will be described. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In this embodiment, a description will be given of an example where a batch type vertical heat treatment device illustrated in FIG. 1 is used as the apparatus of forming a silicon film.

Figure 1:
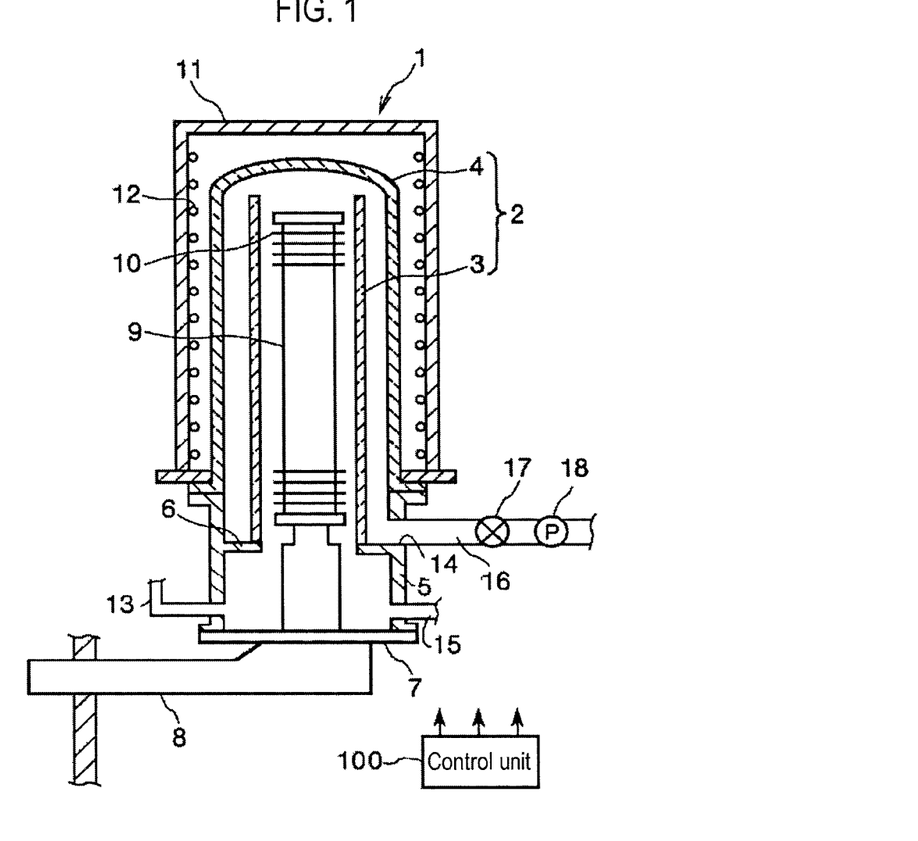
FIG. 1 is a diagram illustrating a heat treatment device according to an embodiment of the present disclosure.

As illustrated in FIG. 1, the heat treatment device 1 includes a reaction tube 2 having a substantially cylindrical shape in which its longitudinal direction is oriented in a vertical direction. The reaction tube 2 has a double tube structure that includes an inner tube 3, and an outer tube 4 having a ceiling formed to cover the inner tube 3 and to have a regular interval between the inner tube 3 and the outer tube 4. The inner tube 3 and the outer tube 4 are formed of materials having excellent heat resistance and corrosion resistance, for example, quartz.

A manifold 5 made of stainless steel (SUS) formed in a cylindrical shape is disposed below the outer tube 4. The manifold 5 is hermetically coupled to the lower end portion of the outer tube 4. Moreover, the inner tube 3 protrudes from an inner wall of the manifold 5 and is supported by a support ring 6 formed integrally with the manifold 5.

A lid 7 is disposed below the manifold 5, and the lid 7 is configured to be vertically movable by a boat elevator 8. Furthermore, when the lid 7 is raised by the boat elevator 8, a lower side of the manifold 5 (a furnace port portion) is closed, and when the lid 7 is lowered by the boat elevator 8, the lower side of the manifold 5 (the furnace port portion) is opened.

A wafer boat 9 made of, for example, quartz, is mounted on the lid 7. The wafer boat 9 is configured to be able to accommodate a plurality of objects to be processed, for example, semiconductor wafers 10, at predetermined intervals in the vertical direction.

A heat insulating member 11 is provided around the reaction tube 2 so as to surround the reaction tube 2. In this embodiment, heating-up heaters 12 which include resistive heating elements are provided on the inner wall surface of the heat insulating member 11. The interior of the reaction tube 2 is heated to a predetermined temperature by the heating-up heaters 12, and as a result, the semiconductor wafer 10 is heated to a predetermined temperature.

A plurality of process gas introduction pipes 13 are inserted (coupled) through the side surface of the manifold 5. Only one of the process gas introduction pipes 13 is illustrated in FIG. 1. The process gas introduction pipe 13 faces the inner tube 3. In this embodiment, as illustrated in FIG. 1, the process gas introduction pipe 13 is inserted through the side surface of the manifold 5 below the support ring 6 (on the lower side of the inner tube 3).

The process gas introduction pipe 13 is coupled to a process gas supply source (not shown) through a mass flow controller (not shown) or the like. Therefore, the desired amount of process gas is supplied into the reaction tube 2 from the process gas supply source through the process gas introduction pipe 13. The process gas supplied from the process gas introduction pipe 13 includes a film forming gas that forms a silicon film (an Si film) such as polysilicon film, amorphous silicon film, or polysilicon film and amorphous silicon film doped with impurities. As the film forming gas, for example, $SiH_4$, $Si_2H_6$ or the like is used when a non-doped Si film, an Si film that is not doped with impurities, is formed. In addition, gasses containing impurities, such as, $P(PH_3)$, $B(BCl_3$ or $B_2H_6)$, $C(C_2H_4)$, $O(N_2O)$, or $N(N_2O)$, and $SiH_4$ or the like are used when an Si film doped with impurities is formed. Further, the above-described $PH_3$, $BCl_3$, or the like is used when doping a non-doped Si film with impurities.

Moreover, in the method of forming the silicon film according to the embodiment, as described below, after Si film is embedded in grooves formed on the surface of the semiconductor wafer 10 in a first film forming step, the opening portions of the grooves embedded are expanded in an etching step, and a second Si film is embedded in the grooves, in which the opening portions are expanded, in a second film forming step. Accordingly, an etching gas is adopted as a process gas supplied from the process gas introduction pipe 13. For example, a halogen gas, such as $Cl_2$, $F_2$, or $ClF_3$, is used as the etching gas.

Further, in the method of forming the silicon film according to the present disclosure, as described below, when a first seed layer is formed on an insulating film 52 and grooves 52a, a seed layer forming gas, for example, a silane containing an amino group or a higher-order silane such as $Si_2H_6$ or $Si_4H_{10}$, is supplied into the reaction tube 2 from the process gas introduction pipe 13.

When a second seed layer is formed after the first film forming step, a silane containing an amino group is supplied into the reaction tube 2 from the process gas introduction pipe 13. The silanes containing the amino group include, for example, bis(tert-butylamino)silane(BTBAS), tri(dimethylamino)silane(3DMAS), tetra(dimethylamino)silane (4DMAS), diisopropylaminosilane(DIPAS), bis(diethylamino)silane(BDEAS), bis(dimethylamino)silane(BDMAS) and the like.

An exhaust port 14 configured to exhaust the gas in the reaction tube 2 is provided on the side of the manifold 5. The exhaust port 14 is placed above the support ring 6, and communicates with a space formed between the inner tube 3 and the outer tube 4 of the reaction tube 2. Moreover, gas or the like generated in the inner tube 3 is exhausted to the exhaust port 14 through the space between the inner tube 3 and the outer tube 4.

A purge gas supply pipe 15 is inserted through the side surface of the manifold 5 below the exhaust port 14. A purge gas supply source (not shown) is coupled to the purge gas supply pipe 15, and a desired amount of purge gas, for example, nitrogen gas, is supplied into the reaction tube 2 from the purge gas source through the purge gas supply pipe 15.

An exhaust pipe 16 is hermetically coupled to the exhaust port 14. A valve 17 and a vacuum pump 18 are interposed in the exhaust pipe 16 from the upstream side thereof. The valve 17 controls the pressure in the reaction tube 2 to a predetermined pressure by adjusting a degree of opening of the exhaust pipe 16. The vacuum pump 18 removes the gas in the reaction tube 2 through the exhaust pipe 16, and adjusts the pressure in the reaction tube 2.

Furthermore, a trap, a scrubber and the like (not shown) are interposed in the exhaust pipe 16, and are configured to detoxify exhaust gas removed from the reaction tube 2 to the outside of the heat treatment device 1.

Figure 2:
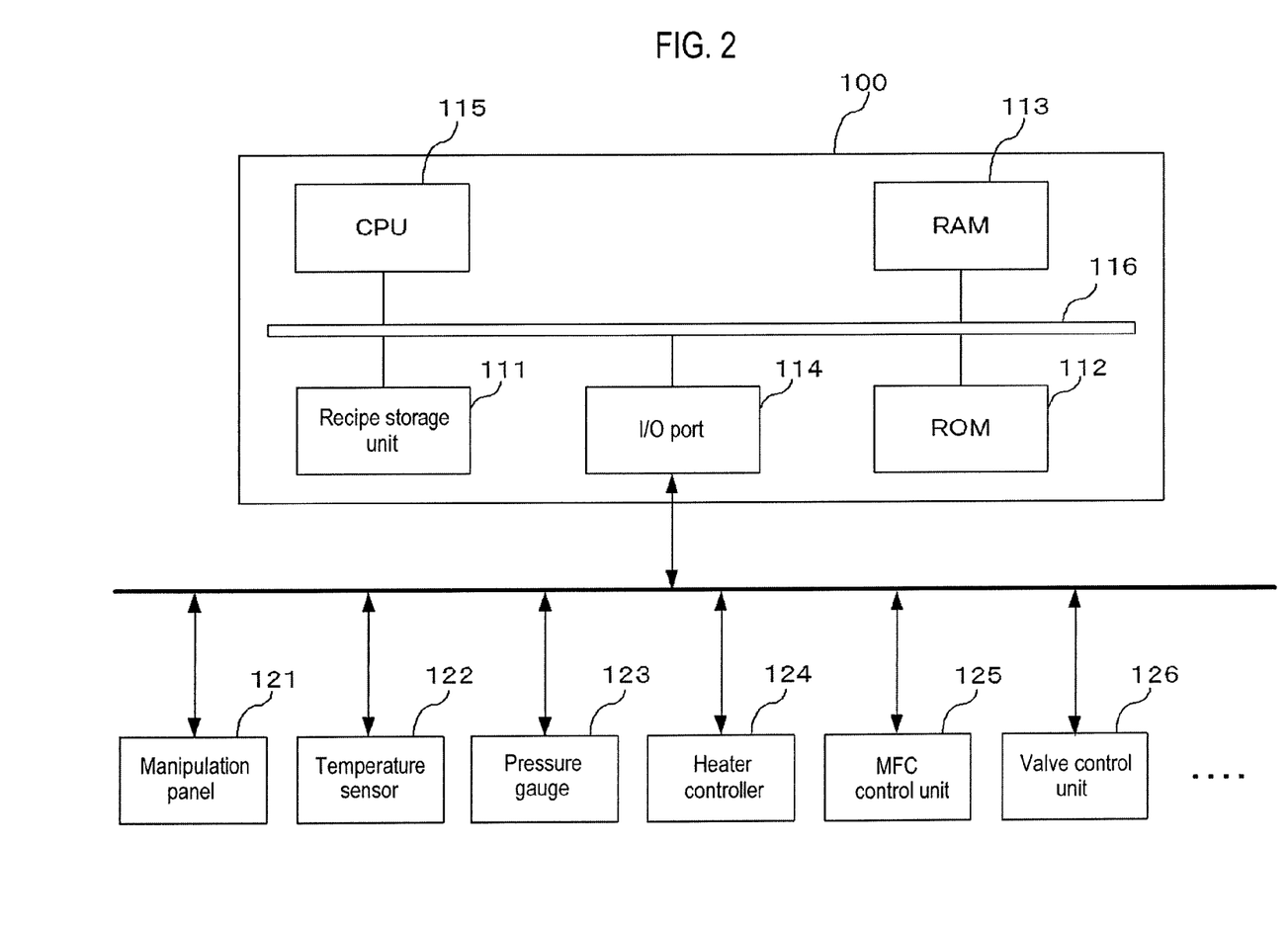
FIG. 2 is a diagram illustrating a configuration of a control unit of FIG. 1.

Furthermore, the heat treatment device 1 includes a control unit 100 that controls the respective parts. FIG. 2 illustrates the configuration of the control unit 100. As illustrated in FIG. 2, a control panel 121, a temperature sensor (group) 122, a pressure gauge (group) 123, a heater controller 124, a MFC (Mass Flow Controller) control unit 125, a valve control unit 126 and the like are connected to the control unit 100.

The control panel 121 includes a display screen and operation buttons, transmits operation instructions of an operator to the control unit 100, and also displays various types of information from the control unit 100 on the display screen.

The temperature sensor (group) 122 measures the temperature of each part, for example, in the reaction tube 2, the process gas introduction pipe 13, and the exhaust pipe 16, and notifies the measurements to the control unit 100.

The pressure gauge (group) 123 measures the pressure of each part, for example, in the reaction tube 2, the process gas introduction pipe 13, and the exhaust pipe 16, and notifies the measurements to the control unit 100.

The heater controller 124 is intended to individually control the heating-up heaters 12 to generate heat by supplying the electric current to the heaters in response to the instructions from the control unit 100, individually measure the power consumption of the heaters, and notify control unit 100 of the measurements.

The MFC control unit 125 controls the mass flow controllers (not shown) provided in the process gas introduction pipe 13 and the purge gas supply pipe 15, sets the flow rate of the gas flowing through these tubes as the amount specified from the control unit 100, measures the flow rate of the actually flowing gas, and notifies the measurements to the control unit 100.

The valve control unit 126 controls a degree of opening of a valve placed in each tube in accordance to the value specified from the control unit 100.

The control unit 100 includes a recipe storage unit 111, a ROM (Read Only Memory) 112, a RAM (Random Access Memory) 113, an I/O (Input/Output) port 114, a CPU (Central Processing Unit) 115, and a bus 116 that connects these components to one another.

A setup recipe and a plurality of process recipes are stored in the recipe storage unit 111. Only the setup recipe is stored when heat treatment device 1 is initially fabricated. The setup recipe is performed when a thermal model or the like is generated according to each heat treatment device. The process recipe is a recipe that is prepared in each heat treatment (process) actually performed by a user, and defines the changes in temperature of each part, the pressure changes in the reaction tube 2, the timing of the start and stop of the supply of the process gas, the supply quantity thereof, or the like, for example, from the time of loading the semiconductor wafer 10 into the reaction tube 2 to the time of unloading the processed semiconductor wafer 10.

The ROM 112 is a recording medium that includes an EEPROM (Electrically Erasable Programmable Read Only Memory), a flash memory, a hard disk, and the like, and stores an operation program or the like of the CPU 115. The RAM 113 serves as a work area of the CPU 115.

The I/O port 114 is connected to the control panel 121, the temperature sensor (group) 122, the pressure gauge (group) 123, the heater controller 124, the MFC control unit 125, the valve control unit 126 and the like, and controls the input and output of data and signal.

The CPU 115 configures the center of the control unit 100, executes a control program stored in the ROM 112, and controls the operation of the heat treatment device 1 depending on the recipe (process recipe) stored in the recipe storage unit 111 in accordance with the instructions from the control panel 121. That is, the CPU 115 allows the temperature sensor (group) 122, the pressure gauge (group)123, the MFC control unit 125 or the like to measure the temperature, the pressure, the flow rate or the like of each part in the reaction tube 2, the process gas introduction pipe 13, and the exhaust pipe 16, outputs the control signal or the like to the heater controller 124, the MFC control unit 125, the valve control unit 126 or the like on the basis of the measurement data, and controls each part to follow the process recipe. The bus 116 transmits the information between the respective parts.

Next, the method of forming the silicon film using the heat treatment device 1 configured as described above will be described. In addition, the operations of the respective parts configuring the heat treatment device 1 are controlled by the control unit 100 (CPU 115) in the following description. Further, the temperature, the pressure, the flow rate of the gas or the like of the reaction tube 2 in each treatment are set to the conditions according to the recipe, for example, as illustrated in FIG. 3, by controlling the heater controller 124 (the heating-up heaters 12), the MFC control unit 125, the valve control unit 126 or the like by the control unit 100 (CPU 115).

Furthermore, in this embodiment, as illustrated in FIGS. 4A through 5F, in the semiconductor wafer 10 as an object to be processed, an insulating film 52 is formed on the substrate 51, and the grooves 52a for forming contact holes are formed on the surface of the object to be processed 10.

The method of forming the silicon film according to the embodiment includes forming a first seed layer 53 on the insulating film 52 and the grooves 52a; forming a first layer of non-doped silicon film 55 (an Si film without impurities, such as a polysilicon or amorphous silicon film) with openings 54; etching the non-doped Si film 55 to expand the openings 54; doping with impurities the non-doped Si film 55 (with expanded openings 54) to form a doped Si film 56, (v) forming a second seed layer 57 on the doped Si film 56; and forming a second layer of P-doped Si film 58, so as to embed the second seed layer 57. Further, in the present disclosure, the first film can also be doped with impurities by in-situ doping, where a gas containing impurities (P) and $SiH_4$ or the like are simultaneously supplied into the reaction tube 2 to introduce P into the Si film. Although the non-doped Si film 55 will have superior surface roughness by etching, if the film is doped at a relatively low concentration, there will not be much difference. Hereinafter, the present disclosure will use the example of forming the non-doped Si film 55 as the first layer film.

Figure 3:
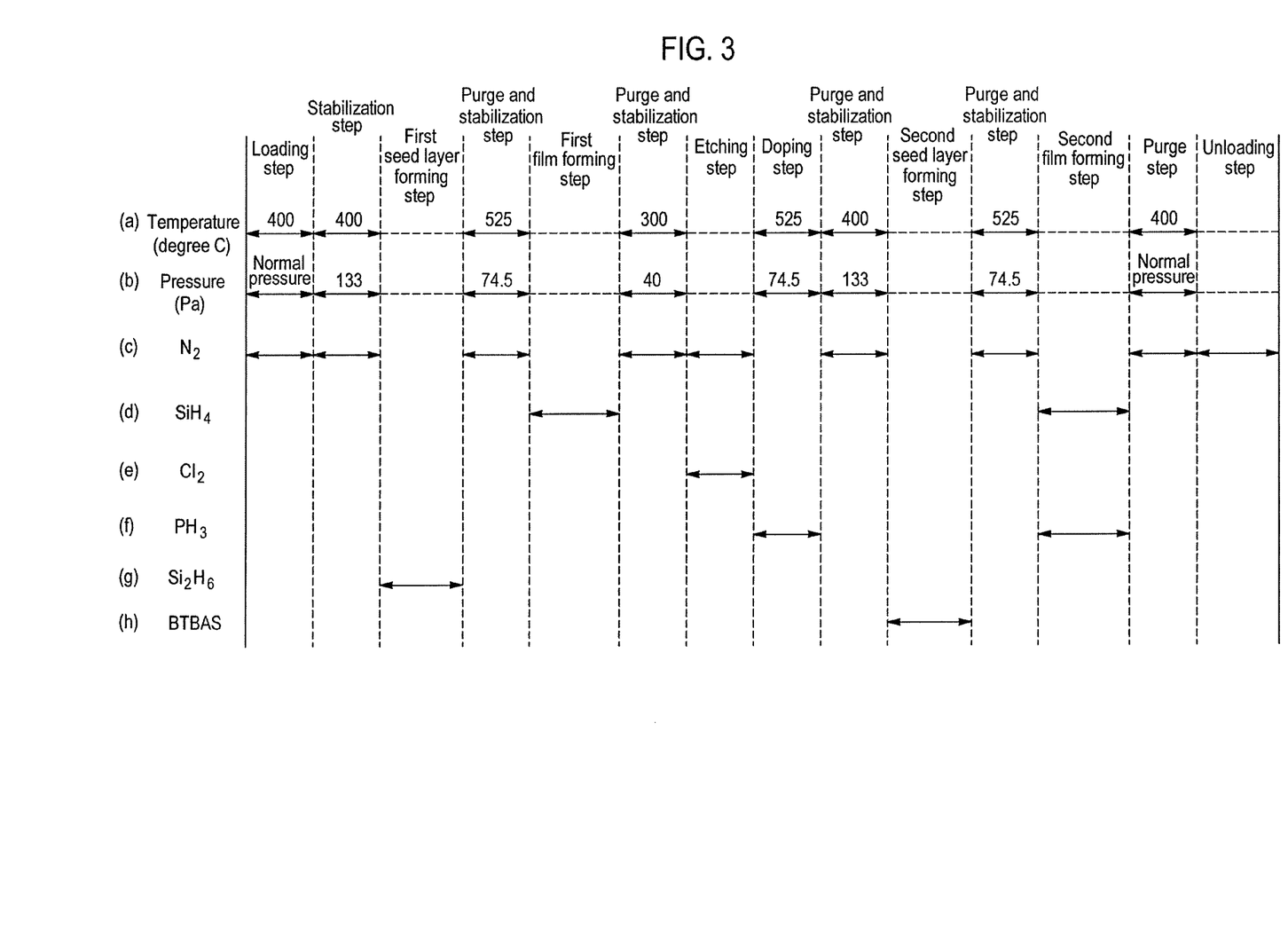
FIG. 3 is a diagram illustrating a recipe that describes a method of forming a silicon film according to an embodiment.
Figure 4A:
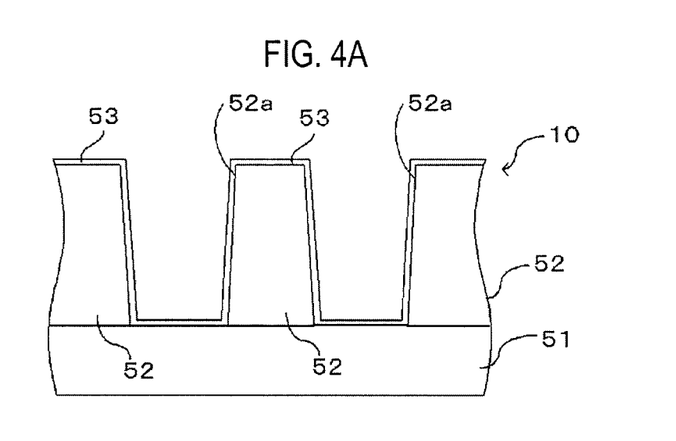
FIGS. 4A to 4F are diagrams illustrating the method of forming the silicon film according to the embodiment.

First, the interior of the reaction tube 2 (the inner tube 3) is set to a predetermined temperature, for example, 400 degrees C. as illustrated in FIG. 3A. Furthermore, as illustrated in FIG. 3C, a predetermined amount of nitrogen is supplied into the inner tube 3 (the reaction tube 2) from the purge gas supply pipe 15. Next, a wafer boat 9 with the semiconductor wafer 10 illustrated in FIG. 4A is mounted on the lid 7. Then, the lid 7 is raised by the boat elevator 8, and the semiconductor wafer 10 (the wafer boat 9) is loaded into the reaction tube 2 (the loading step).

Then, as illustrated in FIG. 3C, a predetermined amount of nitrogen is supplied into the inner tube 3 from the purge gas supply pipe 15, and the interior of the reaction tube 2 is set to a predetermined temperature, for example, 400 degrees C., as illustrated in FIG. 3A. Furthermore, by discharging the gas in the reaction tube 2, the reaction tube 2 is depressurized to a predetermined pressure, for example, 133 Pa (1 Torr), as illustrated in FIG. 3B. Moreover, the interior of the reaction tube 2 is stabilized at this temperature and pressure (a stabilization step).

The temperature in the reaction tube 2 may be 350 degrees C. to 500 degrees C. In addition, when the silane containing the amino group is used as the seed layer forming gas, the temperature in the reaction tube 2 is may be 350 degrees C. to 450 degrees C. Further, the pressure in the reaction tube 2 may be 1.33 Pa to 133 Pa (0.01 Torr to 1 Torr). This is because the seed layer can be more uniformly formed by setting the temperature and the pressure of the reaction tube 2 within these ranges.

When the interior of the reaction tube 2 is stabilized at the predetermined pressure and temperature, the supply of nitrogen from the purge gas supply pipe 15 is stopped. Then, as illustrated in FIG. 3G, a predetermined amount of seed layer forming gas, for example, $Si_2H_6$, is supplied into the reaction tube 2 from the process gas introduction pipe 13 (the first seed layer forming step). As illustrated in FIG. 4A, the first seed layer 53 is formed on the insulating film 52 and the grooves 52a of the semiconductor wafer 10. The thickness of the first seed layer 53 may be approximately 1 nm to 2 nm. In addition, when the silane containing the amino group is used as the seed layer forming gas, the first seed layer 53 may be formed under conditions that do not pyrolyze the film forming gas (source gas).

When the first seed layer 53 having a desired thickness is formed on the semiconductor wafer 10, the supply of the seed layer forming gas from the process gas introduction pipe 13 is stopped.

Subsequently, as illustrated in FIG. 3C, a predetermined amount of nitrogen is supplied into the inner tube 3 from the purge gas supply pipe 15, and the interior of the reaction tube 2 is set to a predetermined temperature, for example, 525 degrees C., as illustrated in FIG. 3A. Furthermore, by discharging the gas in the reaction tube 2, the reaction tube 2 is depressurized to a predetermined pressure, for example, 74.5 Pa (0.56 Torr), as illustrated in FIG. 3B. Moreover, the interior of the reaction tube 2 is stabilized at this temperature and pressure (a purge and stabilization step).

Here, the temperature in the reaction tube 2 may be 450 to 700 degrees C., or some cases 490 to 650 degrees C. In addition, the pressure in the reaction tube 2 may be 1.33 Pa to 133 Pa (0.01 Torr to 1 Torr). This is because the Si film can be more uniformly formed by setting the temperature and the pressure of the reaction tube 2 within these ranges.

Figure 4B:
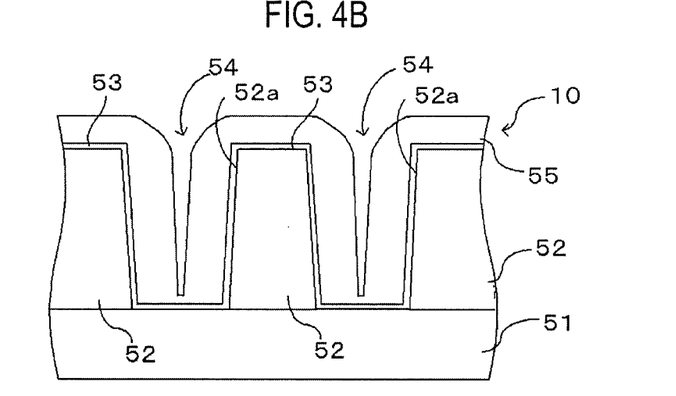

When the interior of the reaction tube 2 is stabilized at the predetermined pressure and temperature, the supply of nitrogen from the purge gas supply pipe 15 is stopped. Then, as illustrated in FIG. 3D, a predetermined amount of film forming gas, for example, $SiH_4$, is supplied into the reaction tube 2 from the process gas introduction pipe 13 (the first film forming step). With the first film forming step, as illustrated in FIG. 4B, the non-doped Si film 55, which is not doped with impurities and has the openings 54, is formed on the first seed layer 53 (on the insulating film 52 and in the grooves 52a) of the semiconductor wafer 10.

Here, the non-doped Si film 55 may be formed on the insulating film 52 and in grooves 52a of the semiconductor wafer 10 so as to have the openings 54 in the first film forming step. That is, in the first film forming step, the non-doped Si film 55 is not formed to completely embed the grooves 52a, but the non-doped Si film 55 may be formed so that the grooves 52a have the openings 54. As a result, it is possible to reliably prevent an occurrence of voids in the grooves 52a in the first film forming step.

When the non-doped Si film 55 reaches a predetermined thickness on the semiconductor wafer 10, the supply of the film forming gas from the process gas introduction pipe 13 is stopped. Then, as illustrated in FIG. 3C, a predetermined amount of nitrogen is supplied into the inner tube 3 from the purge gas supply pipe 15, and the interior of the reaction tube 2 is set to a predetermined temperature, for example, 300 degrees C., as illustrated in FIG. 3A. Furthermore, by discharging the gas in the reaction tube 2, the reaction tube 2 is depressurized to a predetermined pressure, for example, 40 Pa (0.3 Torr), as illustrated in FIG. 3B. Moreover, the interior of the reaction tube 2 is stabilized at this temperature and pressure (a purge and stabilization step). Also, in order to reliably discharge the gas in the reaction tube 2, the discharge of the gas in the reaction tube 2 and the supply of the nitrogen gas may be repeated several times.

Here, the temperature in the reaction tube 2 is in some embodiments 100 degrees C. to 550 degrees C. This is because the non-doped Si film 55 cannot be etched in the later-described etching step if the temperature is lower than 100 degrees C. and it can be difficult to control the etching of the non-doped Si film 55 if the temperature is higher than 550 degrees C. The pressure in the reaction tube 2 is in some embodiments 1.33 Pa to 133 Pa (0.01 Torr to 1 Torr).

Figure 4C:
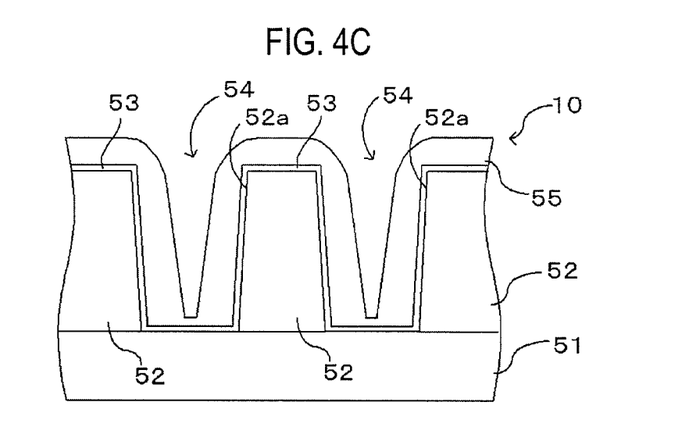

When the interior of the reaction tube 2 is stabilized at the predetermined pressure and temperature, together with the supply of a predetermined amount of nitrogen into the inner tube 3 from the purge gas supply pipe 15 as illustrated in FIG. 3C, a predetermined amount of etching gas, for example, $Cl_2$, is supplied into the reaction tube 2 from the process gas introduction pipe 13 as illustrated in FIG. 3E (an etching step). As illustrated in FIG. 4C, the non-doped Si film 55 with openings 54 formed in the grooves 52a of the semiconductor wafer 10 is etched.

Further, in the etching step, the openings 54 on the non-doped Si film 55 are expanded. That is, as illustrated in FIG. 4C, the etching step is performed such that a large amount of non-doped Si film 55 is etched in the openings 54 while a small amount of the non-doped Si film 55 is etched near bottom of the grooves 52a. Accordingly, in the later-described second film forming step, it is easy to form the Si film in the bottom portions of the grooves 52a. In addition, in the later-described doping step, the non-doped Si film 55 in the vicinity of the bottom portions of the grooves 52a is easily doped with impurities.

Further, the etching gas may include $Cl_2$ with which the etching of the non-doped Si film 55 is easily controlled. When $Cl_2$ is used as the etching gas, the temperature in the reaction tube 2 may be set to 250 degrees C. to 300 degrees C. In addition, the pressure in the reaction tube 2 may be set to 1.33 Pa to 40 Pa (0.01 Torr to 0.3 Torr). Etching uniformity can be realized by setting the temperature and the pressure in the reaction tube 2 within these ranges.

Figure 4D:
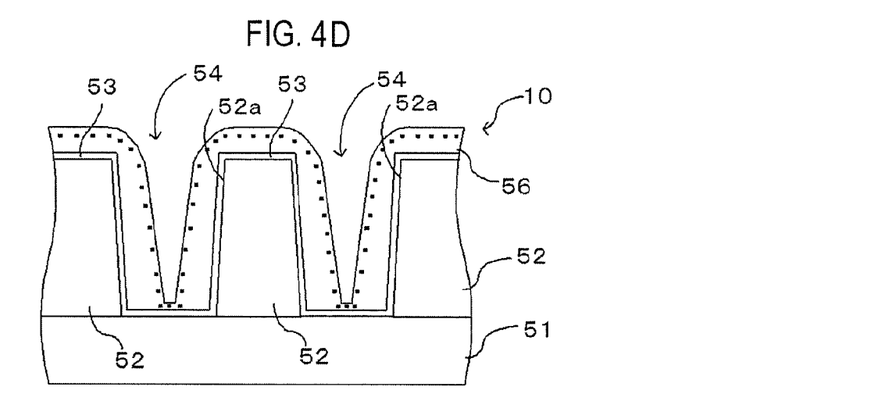

If the desired etching of the non-doped Si film 55 is finished, the supply of the nitrogen from the purge gas supply pipe 15 and the supply of the etching gas from the process gas introduction pipe 13 are stopped. Then, while heating the interior of the reaction tube 2 to a predetermined temperature, for example, 525 degrees C., as illustrated in FIG. 3A, by discharging the gas in the reaction tube 2, the pressure in the reaction tube 2 is increased to a predetermined pressure, for example, 74.5 Pa (0.56 Torr), as illustrated in FIG. 3B. Then, as illustrated in FIG. 3F, a predetermined amount of impurities, for example, $P(PH_3)$, is supplied into the reaction tube 2 from the process gas introduction pipe 13 (a doping step). In the doping step, the non-doped Si film 55 is doped with impurities (P), forming the doped Si film 56 (in this example doped with P) as illustrated in FIG. 4D.

Here, since the non-doped Si film 55 formed in the first film forming step were etched such that the openings 54 were expanded, the non-doped Si film 55 in the vicinity of the bottom portions of the grooves 52a is easily doped with impurities.

Then, as illustrated in FIG. 3C, a predetermined amount of nitrogen is supplied into the inner tube 3 from the purge gas supply pipe 15, and the interior of the reaction tube 2 is set to a predetermined temperature, for example, 400 degrees C., as illustrated in FIG. 3A. Furthermore, by discharging the gas in the reaction tube 2, the pressure in the reaction tube 2 is increased to a predetermined pressure, for example, 133 Pa (1 Torr), as illustrated in FIG. 3B. Moreover, the interior of the reaction tube 2 is stabilized at this temperature and pressure (a purge and stabilization step).

The temperature in the reaction tube 2 may be set to 350 degrees C. to 450 degrees C. In addition, the pressure in the reaction tube 2 may be 1.33 Pa to 133Pa (0.01 Torr to 1 Torr). This is because the second seed layer 57 can be more uniformly formed by setting the temperature and the pressure of the reaction tube 2 within these ranges.

Figure 4E:
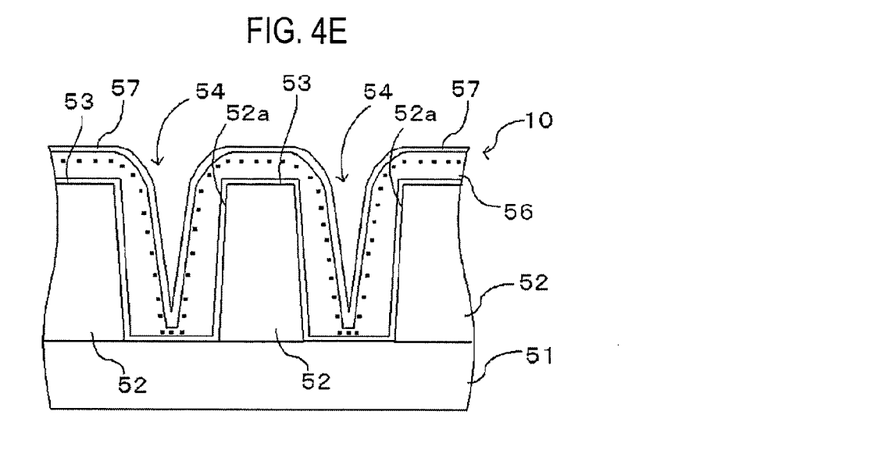

When the interior of the reaction tube 2 is stabilized at the predetermined pressure and temperature, the supply of nitrogen from the purge gas supply pipe 15 is stopped. Then, as illustrated in FIG. 3H, a predetermined amount of seed layer forming gas, for example, the silane containing the amino group, is supplied into the reaction tube 2 from the process gas introduction pipe 13 (a second seed layer forming step). In this example, BTBAS is used as the silane containing the amino group. With the second seed layer forming step, as illustrated in FIG. 4E, the second seed layer 57 is formed on the doped Si film 56 of the semiconductor wafer 10. In addition, when the silane containing the amino group is used as the second seed layer forming gas, the second seed layer 57 may be formed under conditions where the film forming gas (source gas) is not pyrolyzed.

When the second seed layer 57 having a desired thickness is formed on the semiconductor wafer 10, the supply of the second seed layer forming gas from the process gas introduction pipe 13 is stopped.

Here, in this embodiment, since the non-doped Si film 55 is etched the surface roughness is not likely to deteriorate. In contrast, when an Si film doped with a high concentration of P is etched, the P sites will be etched first. This uneven etching can increase surface roughness.

Further, in this embodiment, since the aminosilane-based second seed layer 57 is formed on the P-doped Si film 56, the surface roughness of the subsequent P-doped Si film 58 can be improved, and the Si film can be more appropriately embedded in the later-described second film forming step.

As illustrated in FIG. 3C, a predetermined amount of nitrogen is supplied into the inner tube 3 from the purge gas supply pipe 15, and the interior of the reaction tube 2 is set to a predetermined temperature, for example, 525 degrees C., as illustrated in FIG. 3A. Furthermore, by discharging the gas in the reaction tube 2, the reaction tube 2 is depressurized to a predetermined pressure, for example, 74.5 Pa (0.56 Torr), as illustrated in FIG. 3B. Moreover, the interior of the reaction tube 2 is stabilized at this temperature and pressure (a purge and stabilization step). Furthermore, in order to reliably discharge the gas in the reaction tube 2, the discharge of the gas in the reaction tube 2 and the supply of the nitrogen gas may be repeated several times.

Figure 4F:
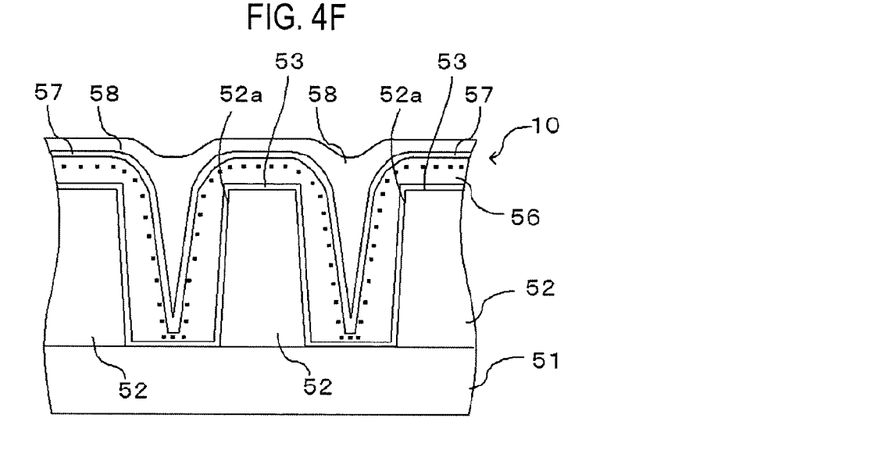

When the interior of the reaction tube 2 is stabilized at the predetermined pressure and temperature, the supply of nitrogen from the purge gas supply pipe 15 is stopped. Then, as illustrated in FIGS. 3D and 3F, predetermined amounts of film forming gases, for example, $SiH_4$ and $PH_3$, are supplied into the reaction tube 2 from the process gas introduction pipes 13 (a second film forming step). With this second film forming step, as illustrated in FIG. 4F, the P-doped Si film 58, which is doped with P, is formed on the second seed layer 57.

Here, since the non-doped Si film 55 formed in the first film forming step was etched and the openings 54 thereof were expanded, the P-doped Si film 58 will easily form in the bottom portions of the grooves 52a. Accordingly, it is possible to suppress an occurrence of voids or seams in the grooves 52a.

When the desired P-doped Si film 58 is formed, the supply of the film forming gas from the process gas introduction pipe 13 is stopped. Next, as illustrated in FIG. 3C, a predetermined amount of nitrogen is supplied into the inner tube 3 from the purge gas supply pipe 15, and the interior of the reaction tube 2 is set to a predetermined temperature, for example, 400 degrees C. as illustrated in FIG. 3A. Further, the gas in the reaction tube 2 is discharged, and the reaction tube 2 is returned to the normal pressure (a purge step). Furthermore, in order to reliably discharge the gas in the reaction tube 2, the discharge of the gas in the reaction tube 2 and the supply of the nitrogen gas may be repeated several times. Moreover, the semiconductor wafer 10 (the wafer boat 9) is unloaded from the reaction tube 2 (an unloading step) by lowering the lid 7 by the boat elevator 8. Thus, the formation of the Si film is finished.

Figure 5A:
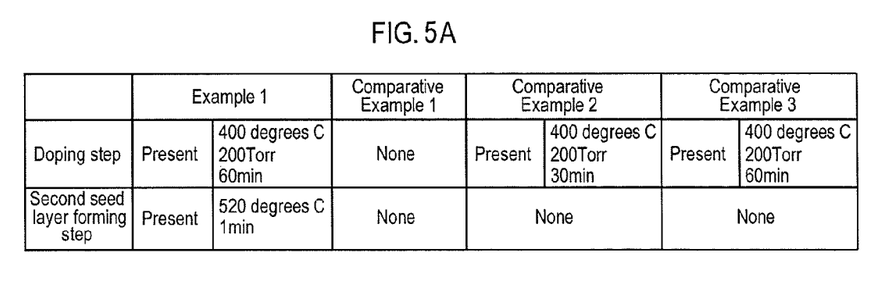
FIGS. 5A to 5C are diagrams illustrating test results of the silicon film forming method in the embodiment.

Then, effects of the method of forming the silicon film according to the present disclosure, in which the second seed layer forming step was performed after the first film forming step were confirmed. FIG. 5A shows differences in manufacturing conditions of Example 1 and Comparative Examples 1 to 3.

In Example 1, a first seed layer was formed on an insulating film formed on a substrate and a non-doped Si film was formed thereon in the same manner as the recipe illustrated in FIG. 3. Here, the non-doped Si film ($Si_2H_6$ film) was formed on the first seed layer under conditions of 400 degrees C., 133.3 Pa (1 Torr), and 32.6 minutes using $Si_2H_6$. Then, by introducing 10% of $PH_3$, the $Si_2H_6$ film was doped with P under conditions of 400 degrees C., 200 Torr, and 60 minutes, as illustrated in FIG. 5A. Subsequently, using BTBAS, a second seed layer was formed under conditions of 520 degrees C. and 1 minute. Then, using $SiH_4$, a non-doped Si film ($SiH_4$ film) was formed under conditions of 520 degrees C., 50 Pa, and 20 minutes.

On the other hand, as illustrated in FIG. 5A, in Comparative Example 1, a film was formed under the same conditions as Example 1 except that no doping step was performed on a non-doped Si film ($Si_2H_6$ film) and no second seed layer was formed. Comparative Example 2 was performed under the same conditions as Comparative Example 1 except that the doping step was performed on an $Si_2H_6$ film for a shorter time (30 minutes) than that of Example 1 as illustrated in FIG. 5A. Comparative Example 3 was performed under the same conditions as Comparative Example 2 except that, for example, the doping step was performed for a longer time than that of Comparative Example 2 and for the same time as Example 1.

Figure 5B:
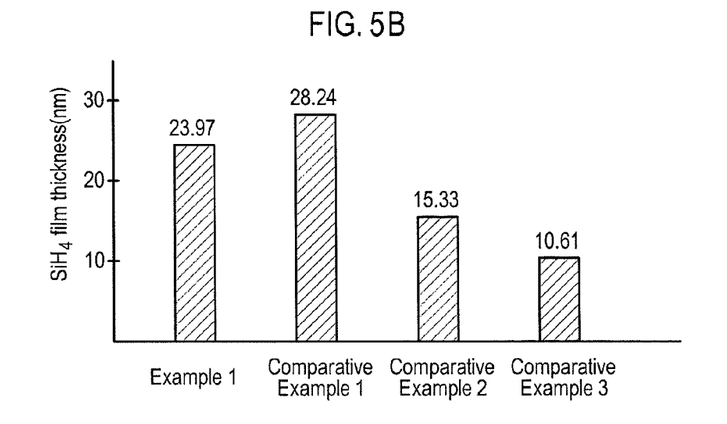

FIG. 5B shows a thickness of the $SiH_4$ film of each Example. Since no doping step was performed in Comparative Example 1 in which no second seed layer is formed, the $SiH_4$ film had a thickness of 28.24 nm. In contrast, Comparative Examples 2 and 3, where doping was performed, only obtained thicknesses of 15.33 nm and 10.61 nm, which were smaller than that of Comparative Example 1. The doping step causes an incubation time to occur on the surface of the $Si_2H_6$ film under the $SiH_4$ film. This incubation time delays the occurrence of Si nuclei and delays the initiation of film formation. This may be because the surface roughness also deteriorates as a result. Further, from Comparative Examples 2 and 3, incubation time increases as the P concentration is increased, thereby decreasing the thickness of the film. As a result, the surface roughness deteriorates. In contrast, in Example 1, the second seed layer made it possible to form an $SiH_4$ film that was as thick as that of Comparative Example 1 (which did not have any doping) while at the same time doping at the same concentration as Comparative Example 3.

Figure 5C:
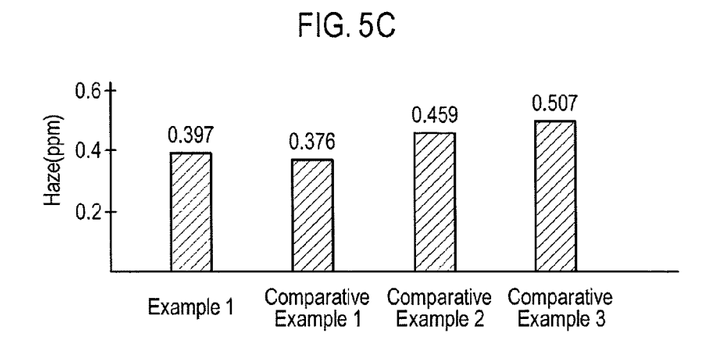

Subsequently, FIG. 5C shows the haze of the $SiH_4$ film of each Example. While the $SiH_4$ film of Comparative Example 1 in which no doping step was performed had a haze of 0.376, the $SiH_4$ film of Comparative Example 2, where doping step was performed, had a worse haze of 0.459, and Comparative Example 3, which was doped with P at a higher concentration had the worst haze of 0.507. In contrast, the $SiH_4$ film of Example 1 in which the second seed layer was formed had a haze of 0.397, which is close to that of Comparative Example 1 (no doping), even though the doping concentration was as high as Comparative Example 3. From these values, it was possible to confirm that the second seed layer can suppress the occurrence of surface roughness.

As described above, according to the embodiment, after the doping step performed on the non-doped Si film 55, the second seed layer 57 is formed on the doped Si film 56, and the P-doped Si film 58 is formed thereon. Accordingly, degradation of the surface roughness of the Si film caused by the doping step can be suppressed, thereby appropriately forming the Si film. In this way, it is possible to form a Si film having good embedding characteristics.

Furthermore, the present disclosure is not limited to the above-described embodiment, and various modifications and applications can be made.

While it has been described as an example in the above embodiment that the non-doped Si film 55 is formed in the first film forming step, an Si film doped with impurities may be formed in the first film by in-situ doping, in which a gas containing impurities (P) and SiH$_4$ or the like are simultaneously supplied into the reaction tube 2 to introduce P into the Si film. Even in this case, as the second seed layer 57 is formed on the Si film doped with impurities and the Si film is formed thereon, the degradation of the surface roughness of the Si film caused by the doping step can be suppressed, thereby appropriately forming the Si film. In this way, it is possible to form the Si film having good embedding characteristics.

While the example in the above-described embodiment formed the first seed layer 53 on the insulating film 52 and the grooves 52a, the present disclosure is not limited thereto and the forming step of the first seed layer 53 may be omitted.

Further, although the example in the above embodiment had an etching step after the first film forming step, the etching step may be omitted.

Furthermore, in the method of forming the silicon film, a step of removing any native oxide film that may form on the bottom portion of the grooves 52a may be performed before the first film forming step in order to suppress degradation of electrode characteristics of the Si film. In such a case, for example, ammonia (NH$_3$) and HF, ammonia and NF$_3$, or the like, are used as native oxide film removing gases, which are simultaneously supplied into the reaction tube 2 from the process gas introduction pipes 13. Further, in the step of removing the native oxide film, the temperature in the reaction tube 2 may be 25 degrees C. to 200 degrees C. In addition, the pressure in the reaction tube 2 may be 0.133 Pa to 133Pa (0.001 Torr to 1 Torr). Also, when ammonia and NF$_3$ are used as the native oxide film removing gases, the temperature of the semiconductor wafer 10 may exceed 600 degrees C.

Furthermore, in the above embodiment, the first film forming step, the etching step and the doping steps can be repeated several times before forming the second seed layer and forming the second film. Also, even when the first seed layer forming step or the native oxide film removal step are performed, the first film forming step, the etching step and the doping steps can be repeated before the second seed layer, and the second film are formed. Repeating these steps can further improve the suppression of voids or seams.

Although the present disclosure has been described as an example of the case of forming the non-doped Si film 55 on the insulating film 52 and in the grooves 52a of the semiconductor wafer 10 to have the openings 54 in the first film forming step in the above embodiment, the non-doped Si film 55 may also be formed so as not to have the openings 54 in the first film forming step. In this case, a Si film doped with impurities may be formed to obtain the same effect as the above embodiment by etching the non-doped Si film 55, doping the non-doped Si film 55 with impurities, and embedding the doped Si film.

Although the present disclosure has been described as an example of the case of using SiH$_4$ as the film forming gas in the above embodiment, another gas may be used if it is a gas capable of forming an Si film, i.e., a polysilicon film or an amorphous silicon film.

While the present disclosure has been described as an example of the case of using P (PH$_3$) as a doping species (impurity) in the above embodiment, the doping species is not limited thereto and may include, for example, B, As, C, O, and N. In addition, the impurity is not limited to one type and may be several types. When several types of impurities are used, an impurity may be including P, B, or As to generate electrical carriers and one or more impurities selected from C, O and N to change properties of crystals. If one or more impurities selected from C, O and N are contained, for example, it is possible to suppress the growth of grains.

While the present disclosure has been described as an example of the case of using Cl$_2$ as the etching gas in the above embodiment, a gas capable of etching the non-doped Si film formed in the first film forming step may be used, and another halogen gas such as F$_2$or ClF$_3$ may also be used.

In the above embodiment, although the present disclosure has been described as an example of the case of using the batch type vertical heat treatment device of the double tube structure as the heat treatment device, for example, the present disclosure may also be applied to a batch type heat treatment device of a single tube structure.

The control unit 100 according to the embodiment of the present disclosure may be implemented using a normal computer system regardless of a dedicated system. For example, it is possible to configure the control unit 100 that performs the above-described process, by installing in a general-purpose computer a program for executing the above-described process from a non-transitory recording medium (a flexible disk, a CD-ROM or the like) storing the program.

Moreover, there are many ways to supply the programs to such a computer. The program can be supplied via a predetermined non-transitory recording medium as described above. Otherwise, the program may also be supplied, for example, via a communication line, a communication network, a communication system or the like. For example, the program may be posted on a bulletin board system (BBS) of the communication network, and may be provided via the network. Moreover, it is possible to perform the process described above, by starting and executing the program under the control of an OS (Operating System) similar to other application programs.

The embodiments of the present disclosure are useful in the method and apparatus of forming a silicon film.

According to the embodiments of the present disclosure, it is possible to appropriately embed a silicon film. Furthermore, it is possible to suppress degradation of the surface roughness.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon film in a groove formed on a surface of an object to be processed, the method comprising:
    forming a first silicon layer on the surface of the object to be processed to embed the groove;
    doping impurities near a surface of the first silicon layer;
    forming a first seed layer on the doped first silicon layer; and
    forming a second silicon layer containing impurities on the first seed layer, wherein forming the first silicon layer includes supplying a gas containing impurities and $SiH_4$ so that the first silicon layer is formed to contain the impurities by in-situ doping.

2. The method of claim 1, further comprising etching the first silicon layer formed in the groove,
wherein in doping the impurities, the impurities are doped near a surface of the etched first silicon layer.

3. The method of claim 2, wherein in forming the first silicon layer, the first silicon layer is formed such that the groove of the object to be processed has an opening portion,
in etching the first silicon layer, the first silicon layer formed in the groove is etched such that the opening portion of the groove is expanded, and
in forming the second silicon layer, the second silicon layer is formed to be embedded in the expanded opening portion of the groove.

4. The method of claim 1, wherein the first seed layer is formed from a silane containing an amino group.

5. The method of claim 1, wherein the impurities include phosphorus.

6. The method of claim 1, wherein forming a second seed layer on a surface of the groove is provided before forming the first silicon layer.

* * * * *